US011042066B2

(12) United States Patent
Miao et al.

(10) Patent No.: US 11,042,066 B2
(45) Date of Patent: Jun. 22, 2021

(54) DISPLAY PANEL AND DISPLAY DEVICE

(71) Applicant: BOE Technology Group Co., Ltd., Beijing (CN)

(72) Inventors: Hao Miao, Beijing (CN); Pengju Zhang, Beijing (CN); Mingxing Liu, Beijing (CN); Haiyan Sun, Beijing (CN); Hong Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 130 days.

(21) Appl. No.: 16/168,916

(22) Filed: Oct. 24, 2018

(65) Prior Publication Data
US 2019/0265556 A1 Aug. 29, 2019

(30) Foreign Application Priority Data

Feb. 28, 2018 (CN) .......................... 201810169520.3

(51) Int. Cl.
*G02F 1/1343* (2006.01)
*G02F 1/1335* (2006.01)
(Continued)

(52) U.S. Cl.
CPC .. *G02F 1/134309* (2013.01); *G02F 1/133512* (2013.01); *G02F 1/133514* (2013.01); *G02F 1/133553* (2013.01); *G02F 1/133603* (2013.01); *H01L 27/1214* (2013.01); *G02F 1/133354* (2021.01); *G02F 1/134345* (2021.01)

(58) Field of Classification Search
CPC ........... G02F 1/134309; G02F 1/33512; G02F 1/33514; G02F 1/33553; G02F 1/133603; G02F 1/133354; G02F 1/134345; G02F 1/134381; G02F 1/169; G02F 1/133555; H01L 27/1214
See application file for complete search history.

(56) References Cited

U.S. PATENT DOCUMENTS 9,190,446 B1 * 11/2015 Chen ................. H01L 27/14616
2010/0039576 A1 2/2010 Lee et al.
(Continued)

FOREIGN PATENT DOCUMENTS

CN 102262322 A 11/2011
CN 102385212 A 3/2012
(Continued)

OTHER PUBLICATIONS

First office action of Chinese application No. 201810169520.3 dated Jul. 1, 2020.
(Continued)

*Primary Examiner* — David D Davis
(74) *Attorney, Agent, or Firm* — Fay Sharpe LLP

(57) ABSTRACT

A display panel and a display device are provided. The display panel includes: a first substrate, a second substrate cell-aligned with the first substrate, a first electrode, a second electrode, the first electrode and the second electrode being used to provide an electric field, and a dimming layer between the first substrate and the second substrate, the dimming layer comprising a two-dimensional material deflected between a direction perpendicular to the first substrate and a direction parallel to the first substrate under the action of the electric field.

20 Claims, 10 Drawing Sheets

(51) Int. Cl.
G02F 1/13357 (2006.01)
H01L 27/12 (2006.01)
G02F 1/1333 (2006.01)

(56) References Cited

U.S. PATENT DOCUMENTS

| | | | |
|---|---|---|---|
| 2014/0211137 A1* | 7/2014 | Kaneoya | C09K 19/44 |
| | | | 349/108 |
| 2015/0177584 A1 | 6/2015 | Shi | |
| 2017/0315374 A1* | 11/2017 | Zhou | G02B 27/30 |
| 2018/0039071 A1* | 2/2018 | He | G02B 26/005 |
| 2018/0081241 A1 | 3/2018 | Fan | |
| 2018/0090638 A1* | 3/2018 | Fan | G02F 1/133602 |
| 2019/0013369 A1* | 1/2019 | Bu | H01L 51/5203 |

FOREIGN PATENT DOCUMENTS

| | | |
|---|---|---|
| CN | 103323999 A | 9/2013 |
| CN | 105607346 A | 5/2016 |
| CN | 106066553 A | 11/2016 |
| CN | 106940499 A | 7/2017 |

OTHER PUBLICATIONS

Second office action of Chinese application No. 201810169520.3 dated Sep. 10, 2020.

* cited by examiner

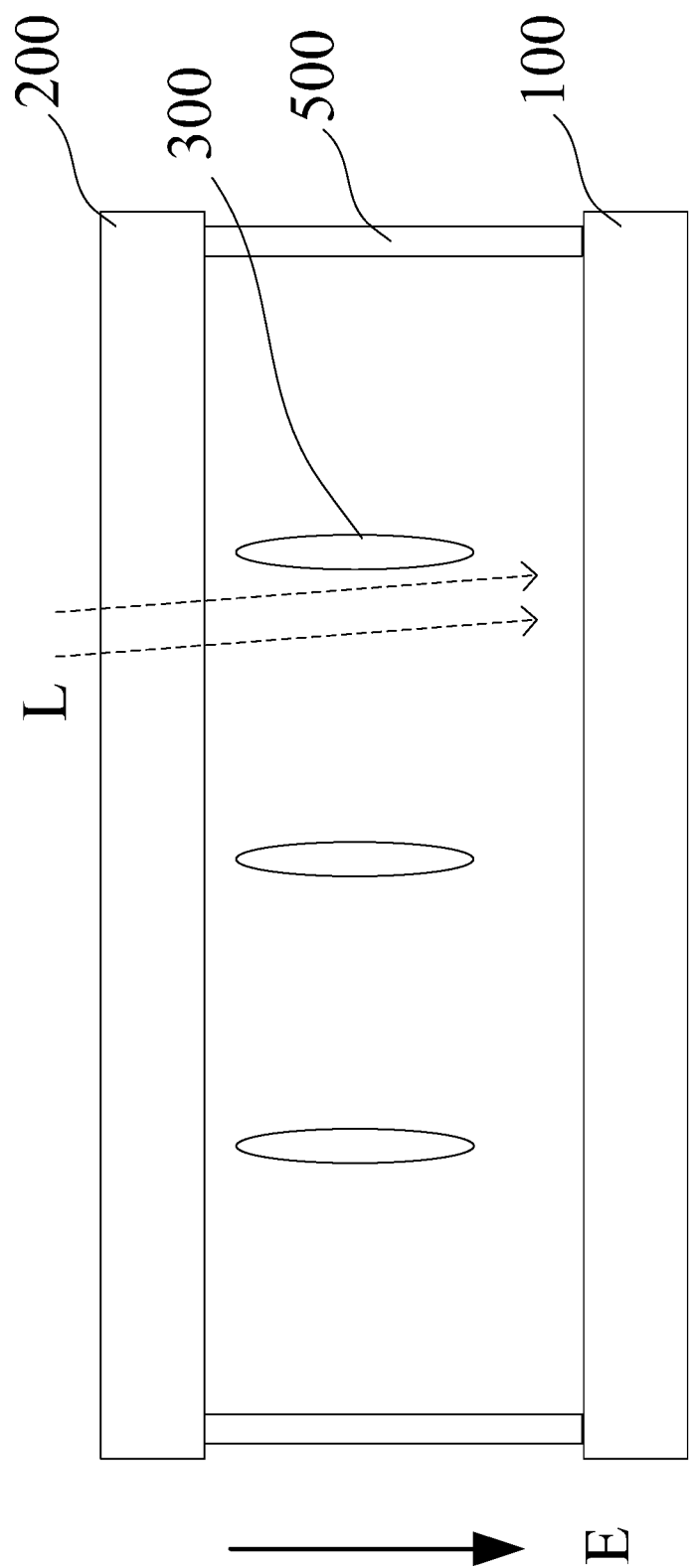

DISPLAY PANEL AND DISPLAY DEVICE

This application claims the priority to the Chinese Patent Application No. 201810169520.3, filed on Feb. 28, 2018 and titled "DISPLAY PANEL AND DISPLAY DEVICE", the disclosure of which are incorporated herein by reference in its entirety.

TECHNICAL FIELD

The present disclosure relates to a display panel and a display device.

BACKGROUND

A Liquid Crystal Display (LCD) is the most common display device currently, and an LCD generally includes two major parts, namely, a backlight source and a liquid crystal display panel. The liquid crystal display panel includes an array substrate and a color filter substrate which are cell-aligned, and a liquid crystal layer is disposed between the array substrate and the color filter substrate. Polaroids are disposed on two sides of the array substrate and two sides of the color film substrate, respectively, and an alignment film is further disposed on the side of the array substrate which is in contact with the liquid crystal layer.

Due to the arrangement of the alignment film, the polaroid, and other structures, the liquid crystal display panel is thick, resulting in difficulty of realizing lightness and thinness, and meanwhile the structure of the film layers of the liquid crystal display panel is complex, thereby affecting the transmittance of the liquid crystal display panel.

SUMMARY

Embodiments of the present disclosure provide a display panel and a display device.

At least one embodiment of the present disclosure provides a display panel, comprising:
  a first substrate;
  a second substrate cell-aligned with the first substrate;
  a first electrode;
  a second electrode, the first electrode and the second electrode being used to provide an electric field; and
  a dimming layer between the first substrate and the second substrate, the dimming layer comprising a two-dimensional material deflected between a direction perpendicular to the first substrate and a direction parallel to the first substrate under the action of the electric field.

Optionally, the two-dimensional material is a reflective material.

Optionally, the dimming layer comprises graphene oxide suspension liquid.

Optionally, a range of grain size of graphene oxide in the graphene oxide suspension liquid is 5~7 μm, and a range of concentration of the graphene oxide suspension liquid is 0.2 wt~0.4 wt %.

Optionally, the graphene oxide in the graphene oxide suspension liquid is doped with a metal material.

Optionally, a surface of the graphene oxide in the graphene oxide suspension liquid is covered with a metal material.

Optionally, an electrical conductivity of the metal material is higher than an electrical conductivity of the graphene oxide in the graphene oxide suspension liquid.

Optionally, a thickness of the dimming layer is 2~5 μm.

Optionally, the display panel further comprises a third electrode; wherein the first electrode and the second electrode are used to form a first-direction electric field; the third electrode and one of the first electrode and the second electrode are used to form a second-direction electric field; and one of the first-direction electric field and the second-direction electric field is an electric field in a direction perpendicular to the first substrate, and the other one of the first-direction electric field and the second-direction electric field is an electric field in a direction parallel to the first substrate.

Optionally, the first electrode is on the first substrate and the second electrode is on the second substrate, the first electrode and the second electrode being used to form the electric field in the direction perpendicular to the first substrate; and the third electrode is on the first substrate, the third electrode and the first electrode being used to form the electric field in the direction parallel to the first substrate.

Optionally, the display panel further comprises: a plurality of sub-pixel units in an arrangement of array in a display area, wherein each of the sub-pixel units comprises one second electrode, and comprises at least one of the first electrodes and at least one of the third electrodes.

Optionally, the display panel further comprises: a plurality of sub-pixel units in an arrangement of array in a display area, wherein each of the sub-pixel units comprises at least one of the first substrates and at least one of the third electrodes, and the second electrode is a surface electrode.

Optionally, one of the first substrate and the second substrate comprises a color filter layer.

Optionally, the display panel further comprises a supporting structure between the second substrate and the first substrate.

Optionally, the display panel further comprises: a light absorbing layer, wherein the second substrate is on a light-emitting side of the display panel and the light absorbing layer is on the first substrate.

Optionally, the light absorbing layer is a black material layer.

At least one embodiment of the present disclosure provides a display device, comprising the display panel in the first aspect.

Optionally, the display device further comprises a backlight source, wherein the second substrate is on a light-emitting side of the display panel and the backlight source is on a side, away from the second substrate, of the first substrate.

BRIEF DESCRIPTION OF THE DRAWINGS

FIG. 8A to FIG. 8B are schematic diagrams illustrating work of a display panel under the action of an electric field in a direction perpendicular to the first substrate.

DETAILED DESCRIPTION

The present disclosure will be described in further detail with reference to the accompanying drawings, to clearly present the principles and advantages of the present disclosure.

Figure 1:
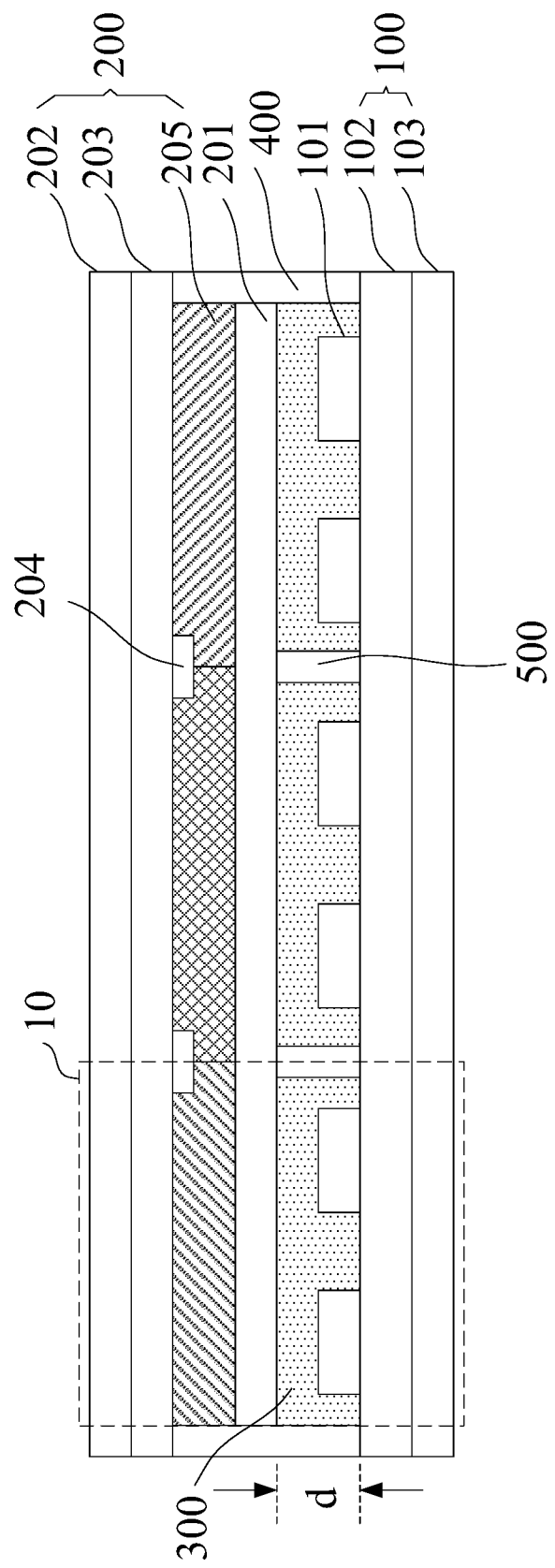
FIG. 1 is a schematic diagram of a structure of a display panel according to an embodiment of the present disclosure.

FIG. 1 is a schematic diagram of a structure of a display panel according to an embodiment of the present disclosure. Referring to FIG. 1, the display panel includes a first substrate 100 and a second substrate 200 which are cell-aligned, and a dimming layer 300 clipped between the first substrate 100 and the second substrate 200.

The display panel further includes a first electrode 101 and a second electrode 201. The first electrode 101 and the second electrode 201 are used to provide an electric field. The dimming layer 300 includes a two-dimensional material. The two-dimensional material (not shown in the Figure) is deflected between the direction perpendicular to the first substrate 100 and the direction parallel to the first substrate 100 under the action of the electric field.

In the embodiments of the present disclosure, the angle of inclination of the two-dimensional material corresponding to each sub-pixel unit may be adjusted by taking the two-dimensional material as the optical switch, and by controlling the magnitude of the electric field through the first electrode and the second electrode. Since the two-dimensional material is opaque, the amount of light emitted after the light passes through the two-dimensional material in the sub-pixel unit is different, thereby realizing different brightness at various points in an picture. Thus, gray-scale control is achieved. Since the display panel is not provided with a liquid crystal layer, there is no need to provide an alignment film and a polaroid, such that the display panel becomes thinner and lighter.

In the embodiments of the present disclosure, the two-dimensional material may be a reflective material. In the environment with light irradiation, the display panel may be a reflective panel. When the two-dimensional material is parallel to the first substrate, light incident from the second substrate is reflected by the two-dimensional material, and then is emitted out from the second substrate to form the bright spot in the picture. When the two-dimensional material is perpendicular to the first substrate, light incident from the second substrate side passes through the dimming layer and will not be reflected by the dimming layer, and thus a dark spot is formed in the picture. However, when the two-dimensional material tilts, as a certain amount of two-dimensional materials are included in each sub-pixel unit in the display panel, the light will be reflected back and forth between the two-dimensional materials and finally some of the light will be reflected. In addition, the greater the angle of inclination (which is an acute angle here) between the two-dimensional material and the first substrate is, the less the amount of reflected light is. By the above solution, not only the alignment film and the polaroid can be omitted, but also the backlight electric energy can be saved, thereby reducing power consumption of the display panel. Furthermore, the display device with this display panel may not be provided with a backlight source, and the display function of the display device may be realized by reflecting the ambient light by the two-dimensional material. As no backlight source is provided, the thickness of the display device is greatly reduced, which can realize the lightness and thinness of the display device.

In other embodiments, when the two-dimensional material only has a light-shielding function, and does not have a light reflecting function, a backlight source needs to be provided on the side of the first substrate. Under the action of the backlight source, when the two-dimensional material is parallel to the first substrate, the light incident from the first substrate is shielded by the two-dimensional material, and thus a dark spot is formed in the picture. When the two-dimensional material is perpendicular to the first substrate, light incident from the first substrate passes through the dimming layer and is not shielded by the dimming layer, and is emitted from the second substrate to form a bright spot in the picture. When the two-dimensional material tilts, a part of the light passes through the dimming layer and is emitted out. In addition, the greater the angle of inclination (which is an acute angle here) of the two-dimensional material with respect to the first substrate is, the more the amount of light is emitted.

In the embodiments of the present disclosure, one of the first substrate 100 and the second substrate 200 is an array substrate, and the other is a color film substrate. In the following description, the detailed structure of the display panel in the present disclosure is illustrated by taking an example in which the first substrate 100 is an array substrate and the second substrate 200 is a color film substrate.

Figure 2:
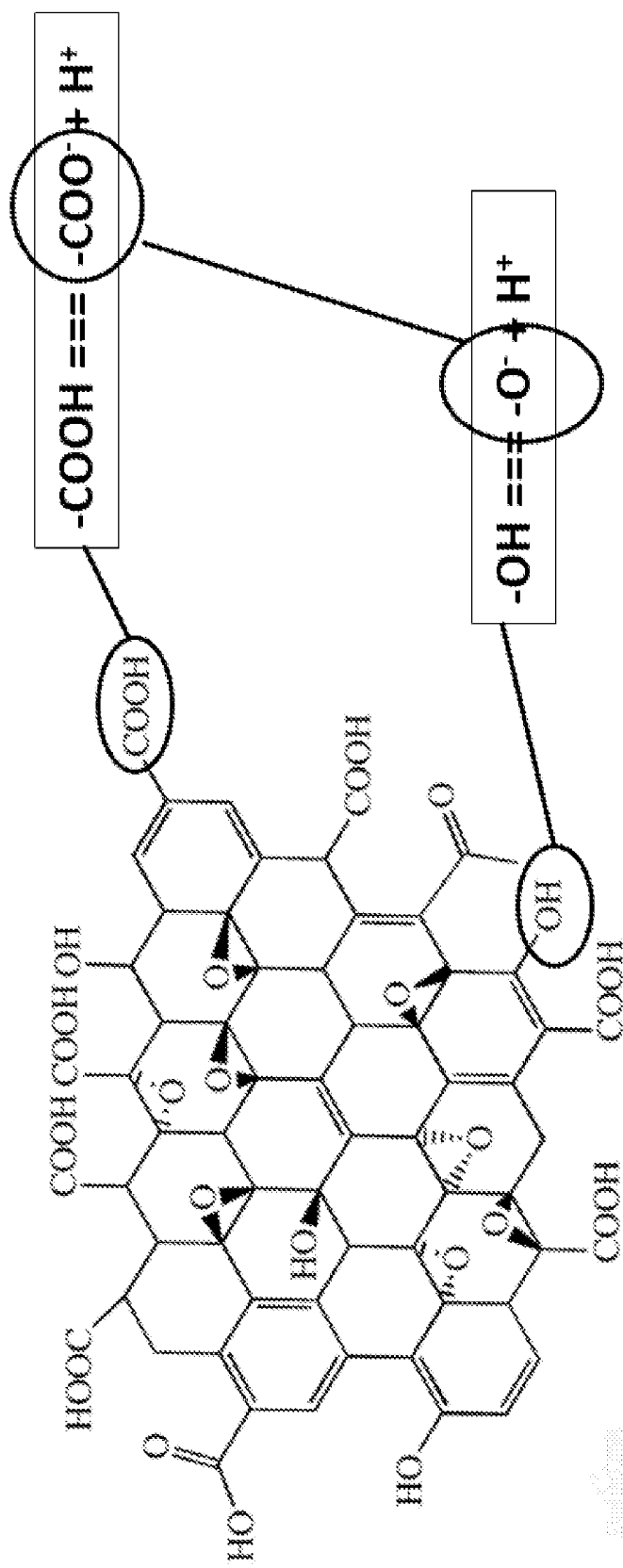
FIG. 2 is a schematic diagram of a structure of graphene oxide.

In the embodiments of the present disclosure, the two-dimensional material may be graphene oxide. Thus, in the embodiments of the present disclosure, the dimming layer 300 may include graphene oxide suspension liquid. The dimming layer 300 may be a single layer of graphene oxide suspension liquid, and may also be a multilayer of graphene oxide suspension liquid. The single layer of graphene oxide suspension liquid and the multilayer of graphene oxide suspension liquid have different thicknesses. The dimming layer 300 has a small thickness when adopting the single layer of graphene oxide suspension liquid, and the display panel is lighter and thinner. When adopting the multilayer of graphene oxide suspension liquid, the reflectivity of the dimming layer 300 on light may be increased, thereby avoiding light leakage. The graphene oxide in the single layer of suspension liquid or the multilayer of suspension liquid may be a single layer of graphene oxide, and may also be a multilayer of graphene oxide. Exemplarily, the graphene oxide in the single layer of graphene oxide suspension liquid may be a single layer of graphene oxide and may also be a multilayer of graphene oxide, and the graphene oxide in the multilayer of graphene oxide suspension liquid may be a single layer of graphene oxide and may also be a multilayer of graphene oxide. Graphene oxide is oxide of graphene. After oxidation, there are more oxygen-containing functional groups in the graphene oxide than those in the graphene, such that the graphene oxide is more active than graphene, and the property can be improved through various reactions with oxygen-containing functional groups. FIG. 2 is a schematic diagram of a structure of graphene oxide. Referring to FIG. 2, the hydroxyl and carboxyl on the surface of the graphene oxide have a weak electronegativity after hydrolyzation. Thus, the graphene oxides are mutually exclusive and the molecular alignment tends to be consistent, such that the graphene oxide in the suspension liquid is arranged in nematic. The graphene oxide in the graphene oxide suspension liquid may be in a structure of a nearly elliptic sheet. The graphene oxide in the graphene oxide suspension liquid is approximately in a parallel arrangement in the direction of long axis, and has fluidity and optical anisotropy, which is similar to a nematic liquid crystal. In the electric field, the surface of the graphene oxide generates surface current along the direction of long axis, and a strong enough electric field may make the graphene oxide stabilize in the direction parallel to the electric field. Therefore, by changing the direction of the electric field, the graphene oxide may be controlled to be deflected. In the embodiments of the present disclosure, by dropping graphene oxide suspension liquid between the first substrate and the second substrate, the graphene oxide may be controlled to be deflected along with the electric field by an external electric field, thereby controlling the reflectivity of the graphene oxide suspension liquid, so as to control the picture presented on the display panel. It should be noted that the shape of the graphene oxide may be prepared as required. In the present disclosure, a nearly elliptic sheet structure is adopted, which is convenient to control the electric field. In other embodiments, the graphene oxide with other shapes may be prepared, which is not limited in the present disclosure.

In order to ensure that the graphene oxide suspension liquid will not flow out, an encapsulation structure 400 is further disposed between the first substrate 100 and the second substrate 200, to ensure that the graphene oxide suspension liquid is sealed between the first substrate 100 and the second substrate 200.

The graphene oxide suspension liquid may be made by an Improved Hummers method. The process of making the graphene oxide suspension liquid by the Hummers method is as follows: oxidizing graphene by using a mixture of concentrated sulfuric acid, concentrated phosphoric acid and potassium permanganate whose mass ratio if 9:1:6. Here, the graphene is powdered graphene. The potassium permanganate and graphene power in the mixture are oxidized to obtain a brown graphene flake having derivative carboxylic acid groups at the edge thereof, and being mainly a phenolic hydroxyl group and an epoxy group in the plane. The graphene flakes are stripped into graphene oxide by ultrasound or high shear vigorous stirring and then stable and light brown graphene oxide suspension liquid is formed in water.

Furthermore, in the embodiments of the present disclosure, the graphene oxide in the graphene oxide suspension liquid is big grain-size graphene, whose grain-size range is 5-7 µm. The graphene oxide suspension liquid has relatively high concentration. For example, the concentration range is 0.2 wt-0.4 wt %. The graphene oxide with a small grain-size and low concentration (such as, 0.51 µm, 1 wt %) mainly presents a property of birefringence similar to liquid crystal, and has a certain property of light reflection. While, the graphene oxide has a big grain size and when the concentration reaches to a certain value, the property of birefringence disappears, and the graphene only has the properties of light shielding and reflection. Thus, among the above value range in the present disclosure, the graphene oxide suspension liquid only has the properties of light shielding and reflection, such that the graphene oxide suspension liquid can satisfy the demands of the dimming layer in the present disclosure.

In the embodiments of the present disclosure, the graphene oxide in the graphene oxide suspension liquid is doped with a metal material or the surface of the graphene oxide in the graphene oxide suspension liquid is covered with a metal material. By doping the metal material, the metal ions can enter the structure of the graphene oxide, and the metal ions and the atoms in the graphene oxide form a coordination, which may increase the reflectivity of the graphene oxide, thereby improving the display brightness. This effect can also be achieved by coating the surface of the graphene oxide with a metal material. As the reflectivity of the metal material is higher than that of the graphene oxide, the reflectivity of the graphene oxide may be increased by coating the surface of the graphene oxide with the metal material.

In the embodiments of the present disclosure, the electrical conductivity of the metal material is higher than the electrical conductivity of the graphene oxide in the graphene oxide suspension liquid. The electrical conductivity may be further increased by doping or coating with the metal material having a high electrical conductivity, such that the graphene oxide may be controlled more easily through the electric field generated by the electrodes.

Alternatively, the above-mentioned metal material may be metal or an alloy, such as silver (Ag) or any alloy of silver and magnesium (Mg), etc.

In the embodiments of the present disclosure, the thickness of the dimming layer 300 may be 2-5 µm, and the thickness of the dimming layer 300 is the distance between the first substrate 100 and the second substrate 200, i.e., d shown in FIG. 1. By adopting the dimming layer with such a thickness, the reflective function on light can be ensured to be achieved, and meanwhile the overall display panel will not be too thick. Exemplarily, the thickness of the dimming layer 300 may be 3-4 µm, such as 3.5 µM.

In the embodiments of the present disclosure, the display panel may further include a third electrode. The first electrode 101 and the second electrode 201 are used to form a first-direction electric field. In an implementation, the third electrode and the first electrode 101 are used to form a second-direction electric field. In another implementation, the third electrode and the second electrode 201 are used to form a second-direction electric field. The first-direction electric field is an electric field in the direction perpendicular to the first substrate, and the second-direction electric field is an electric field in the direction parallel to the first substrate. Alternatively, the first-direction electric field is an electric field in the direction parallel to the first substrate, and the second-direction electric field is an electric field in the direction perpendicular to the first substrate. That is, by arranging the first electrode, the second electrode and the third electrode, the electric field in the direction parallel to the first substrate and the electric field in the direction perpendicular to the first substrate are achieved at the same time, thereby facilitating the control of the two-dimensional material.

When the display panel includes the third electrode, the method of forming the electric field includes the following four circumstances.

The first electrode 101 and the second electrode 201 are used to form the first-direction electric field, and the third electrode and the first electrode 101 are used to form the second-direction electric field. The first-direction electric field is an electric field in the direction perpendicular to the first substrate, and the second-direction electric field is an electric field in the direction parallel to the first substrate.

The first electrode 101 and the second electrode 201 are used to form the first-direction electric field, and the third electrode and the second electrode 201 are used to form the second-direction electric field. The first-direction electric field is an electric field in the direction perpendicular to the first substrate, and the second-direction electric field is an electric field in the direction parallel to the first substrate.

The first electrode 101 and the second electrode 201 are used to form the first-direction electric field, and the third electrode and the first electrode 101 are used to form the second-direction electric field. The first-direction electric field is an electric field in the direction parallel to the first substrate, and the second-direction electric field is an electric field in the direction perpendicular to the first substrate.

The first electrode 101 and the second electrode 201 are used to form the first-direction electric field, and the third electrode and the second electrode 201 are used to form the second-direction electric field. The first-direction electric field is an electric field in the direction parallel to the first substrate, and the second-direction electric field is an electric field in the direction perpendicular to the first substrate.

In the first implementation of the embodiments of the present disclosure, the first electrode 101 is disposed on the first substrate 100, that is, the first electrode 101 is located on the first substrate 100. The second electrode 201 is disposed on the second substrate 200, that is, the second electrode 201 is located on the second substrate 200. An electric field in the direction perpendicular to the first substrate is formed between the first electrode 101 and the second electrode 201.

In the embodiments of the present disclosure, at least one of the first electrode 101 and the second electrode 201 in the display panel is multiple and disposed in an array, so as to control the sub-pixels in the display panel, respectively.

When the display panel includes a plurality of first electrodes 101 arranged in an array, the first electrodes 101 are block electrodes. When the display panel includes a plurality of second electrodes 201, the second electrodes 201 are block electrodes. Here, the block electrodes may be rectangular. The rectangular electrodes are able to facilitate the manufacture of the electrodes. Certainly, in other implementations, the block electrode may also be in other shapes, such as a circle, a trapezoid, a semicircle, etc. When the display panel includes only one first electrode 101, the first electrode 101 is a surface electrode. When the display panel includes only one second electrode 201, the second electrode 201 is a surface electrode.

In the embodiments of the present disclosure, the display panel includes a plurality of sub-pixel units arranged in an array in a display area (reference numeral 10 in FIG. 1 is one sub-pixel unit). Each of the sub-pixel units includes at least one first electrode 101 or at least one second electrode 201. Alternatively, the sub-pixel units includes at least one first electrode 101 and at least one second electrode 201. Each of the sub-pixel units includes the same number of first electrodes 101 and the same number of the second electrodes 201.

In the embodiments of the present disclosure, the first implementation includes the following three circumstances. In the first circumstance, the first electrode 101 is a surface electrode, and the display panel includes a plurality of second electrodes 201 distributed in an array. In this circumstance, each of the sub-pixel units includes at least one second electrode 201, and the projections of respective second electrodes 201 in the plane of the first electrode 101 are all located within the first electrode 101. In the second circumstance, the second electrode 201 is a surface electrode, and the display panel includes a plurality of first electrodes 101 distributed in an array. This circumstance is similar to the first circumstance, and is not repeated herein. In the third circumstance, the display panel includes a plurality of first electrodes 101 distributed in an array and a plurality of second electrodes 201 distributed in an array. The first electrodes 101 and the second electrodes 201 in each sub-pixel unit are arranged oppositely. The first electrode 101 and the second electrode 201 may be one to one or one to many or many to one.

Figure 3:
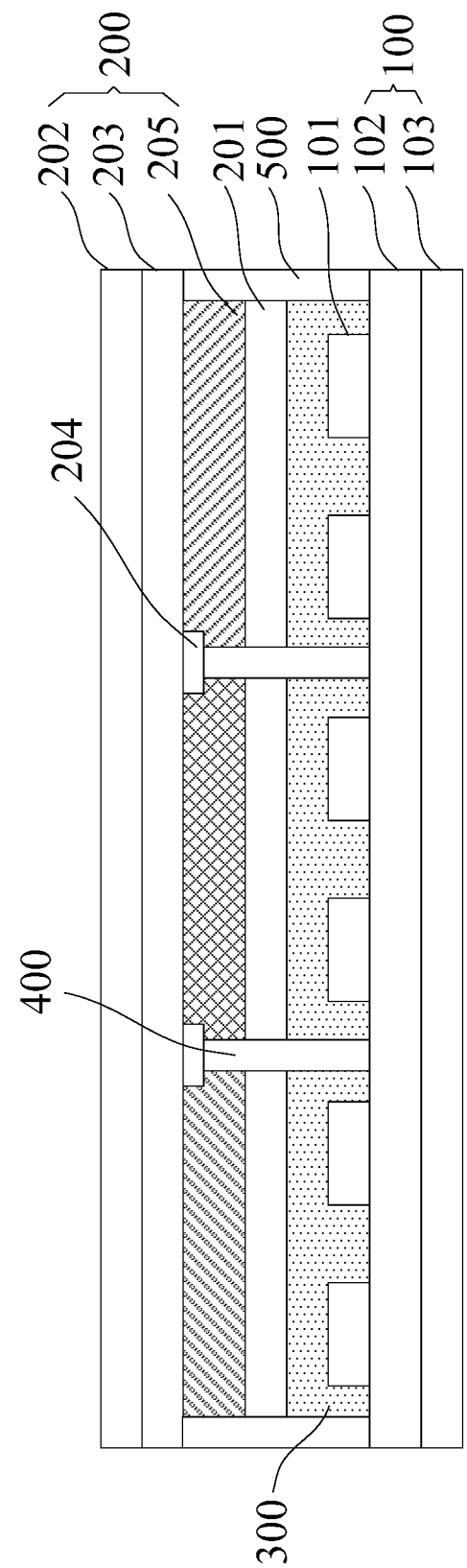
FIG. 3 is a schematic diagram of a structure of another display panel according to an embodiment of the present disclosure.

In the structure shown in FIG. 1, the display panel includes a plurality of first electrodes 101, and the second electrode 201 is a surface electrode. The manufacturing process is relatively simple when using the surface electrode to manufacture the second electrode 201. FIG. 3 is a schematic diagram of a structure of another display panel according to an embodiment of the present disclosure. The difference between FIG. 3 and FIG. 1 lies mainly in the arrangement of the second electrode 201. As shown in FIG. 3, the display panel includes a plurality of second electrodes 201. A second electrode 201 is disposed in one sub-pixel unit of the display panel, and each second electrode 201 is opposite to two first electrodes 101. When a plurality of second electrodes 201 are used, the voltage provided by the second electrode 201 in each sub-pixel unit may be controlled individually, so as to achieve finer control over the electric field, thereby improving the display accuracy. Certainly, the number of the first electrodes 101 opposite to each second electrode 201 may be set based on actual demands. For example, one second electrode 201 is opposite to one first electrode 101. Alternatively, one second electrode 201 is opposite to three or more first electrodes 101. Here, being opposite means that the projection of the first electrode 101 in the plane of the second electrode 201 is located within the second electrode 201, or the projection of the second electrode 201 in the plane of the first electrode 101 is located within the first electrode 101.

In the second implementation of the embodiments of the present disclosure, both the first electrode 101 and the second electrode 201 are on the first substrate 100 or on the second substrate 200. An electric field in the direction parallel to the first substrate is formed between the first electrode 101 and the second electrode 201, and at least one kind of the first electrode 101 and the second electrode 201 includes multiple and is arranged in an array.

In the embodiments of the present disclosure, at least one kind of the first electrode 101 and the second electrode 201 in the display panel includes multiple and is arranged in an array, so as to control the sub-pixels in the display panel, respectively.

In the second implementation, the first electrode 101 and the second electrode 201 may be arranged in the same layer or in a compartment.

Figure 4:
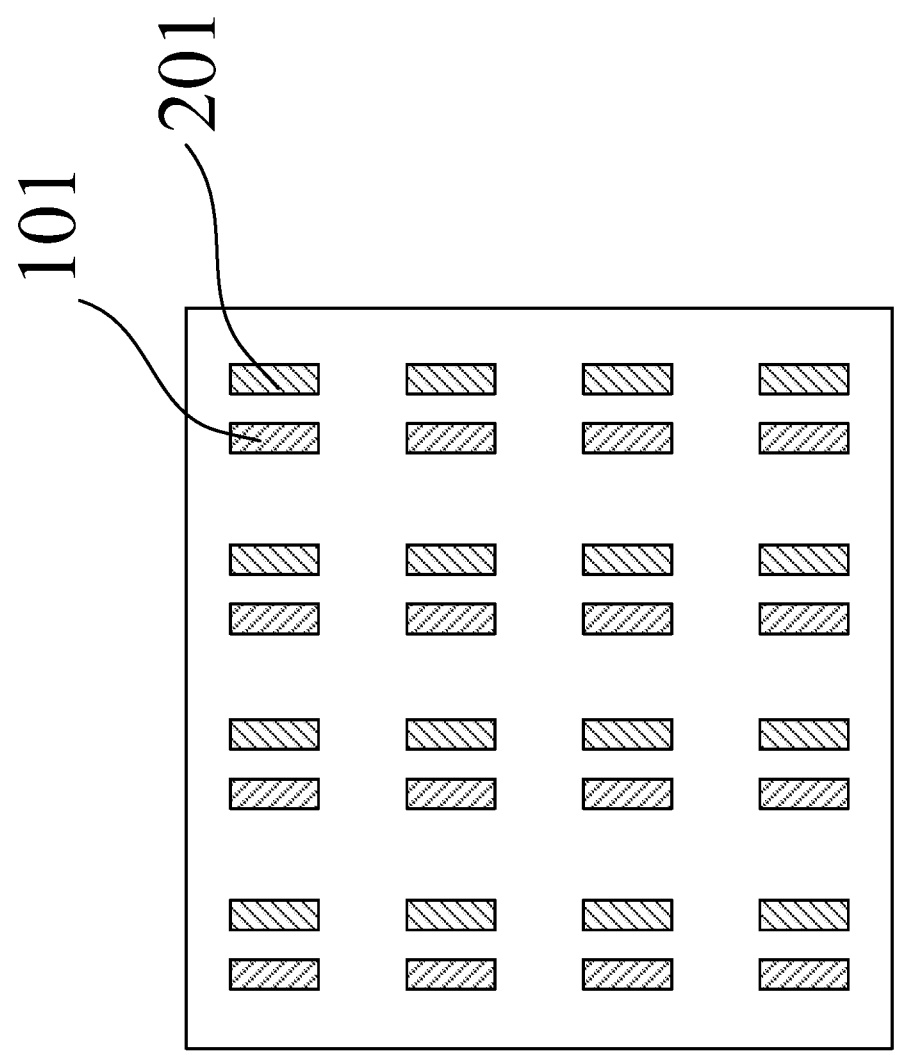
FIG. 4 is a schematic diagram of distribution of a first electrode and a second electrode according to an embodiment of the present disclosure.

When the first electrode 101 and the second electrode 201 are arranged in the same layer, a plurality of first electrodes 101 and a plurality of second electrodes 201 are arranged in a array, and at least one first electrode and one second electrode are arranged in each sub-pixel unit. An electric field in the direction parallel to the first substrate is formed between the electrodes (the first electrode and the second electrode), and the magnitude of the electric field in the direction parallel to the first substrate may be controlled by controlling the voltage difference between the electrodes. When the voltages of the electrodes are equal, the electric field in the direction parallel to the first substrate is 0. When the voltages of the electrodes are not equal, there exists an electric field in the direction parallel to the first substrate. Each sub-pixel unit includes the same number of first electrodes 101 and the same number of second electrodes 201. FIG. 4 shows a schematic diagram of one kind of distribution of the first electrodes and the second electrodes. As shown in FIG. 4, the first electrodes 101 and the second electrodes 201 are arranged in the same layer, and both the first electrodes 101 and the second electrodes 201 are arranged in an array. The first electrodes 101 and the second electrodes 201 are arranged in pairs, and thus an electric field in the direction parallel to the first substrate is formed between a pair of first electrode 101 and second electrode 201.

Exemplarily, in each sub-pixel unit, one first electrode and one second electrode form an electrode pair, and each electrode pair is used to provide an electric field in the direction parallel to the first substrate. One, two or more electrode pairs may be included in each sub-pixel unit.

When more than two electrodes (first electrode and second electrode) are arranged in one sub-pixel unit, the two or more electric fields in different directions may be formed among the respective electrodes, and all of the electric fields in different directions are electric fields in the directions parallel to the first substrate, thereby enabling to control the two-dimensional material to reach to the horizontal or tilted state faster. For example, one first electrode and two second electrodes are arranged in one sub-pixel unit. In this case, an electric field is formed between the first electrode and the two second electrodes.

When the first electrode 101 and the second electrode 201 are arranged in a compartment, the display panel includes a plurality of first electrodes 101 arranged in an array. The second electrodes 201 are common electrodes insulated from the first electrodes 101. An electric field in the direction parallel to the first substrate is formed between the common electrode and the first electrode 101. Alternatively, the common electrode may be arranged below the first electrode. When an electric field is formed between each of the first electrodes and the common electrode, the electric field has a certain horizontal component. That is, the electric field in the direction parallel to the first substrate may be provided. When the voltage of the first electrode and the voltage of the common electrode are equal, the electric field in the direction parallel to the first substrate is 0.

Exemplarily, at least one first electrode 101 is arranged in each sub-pixel unit, and each sub-pixel unit includes the same number of first electrodes 101. An electric field is formed between each of the first electrodes and the common electrode.

Certainly, when the first electrode 101 and the second electrode 201 are arranged in a compartment, the display panel may also include a plurality of second electrodes 201 arranged in an array. The first electrode 101 is a common electrode which is insulated from the second electrode 201. An electric field in the direction parallel to the first substrate is formed between the common electrode and the second electrode 201.

The arrangement of the third electrode in the above-mentioned first implementation and second implementation will be described below.

In first implementation, the third electrode is disposed on the first substrate 100. That is, the third electrode is located on the first substrate 100. An electric field in the direction parallel to the first substrate is formed between the third electrode and the first electrode 101. The third electrode and the first electrode 101 may be arranged in the same layer or in a spacer manner. The arrangement is the same as the above-mentioned arrangement of the first electrode and the second electrode on the same substrate.

In second implementation, the third electrode is located on the second substrate 200. An electric field in the direction perpendicular to the first substrate is formed between the third electrode and the first electrode 101 and between the third electrode and the second electrode 201.

Figure 5:
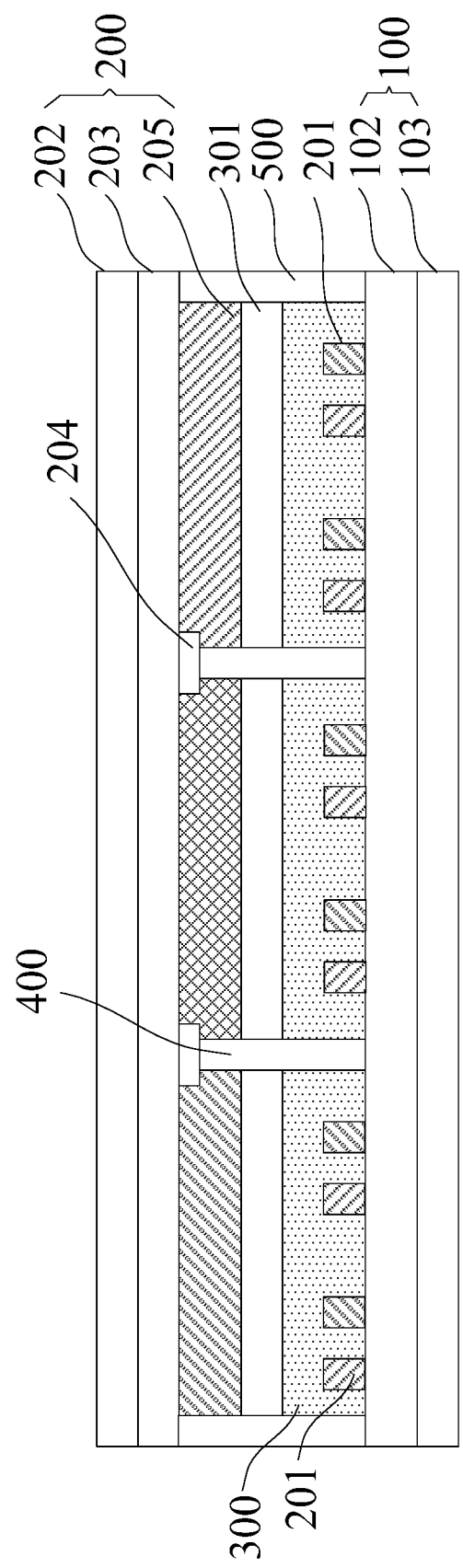
FIG. 5 is a schematic diagram of a structure of yet another display panel according to an embodiment of the present disclosure.
Figure 6:
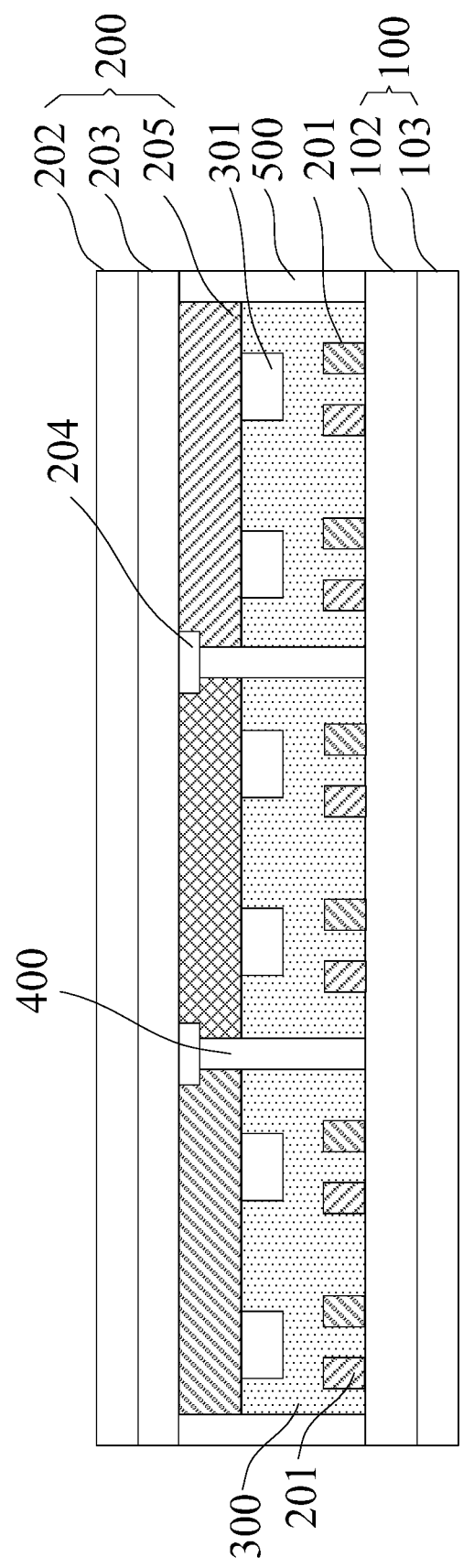
FIG. 6 is a schematic diagram of a structure of still yet another display panel according to an embodiment of the present disclosure.

When the third electrode is located on the second substrate 200, a plurality of third electrodes are arranged in an array on the second substrate, and each sub-pixel unit includes at least one third electrode. Alternatively, the third electrode located on the second substrate 200 is a surface electrode. FIG. 5 shows a schematic diagram of a structure of a display panel according to an embodiment of the present disclosure, and FIG. 5 shows the third electrode 301. As shown in FIG. 5, the first electrode 101 and the second electrode 201 are arranged in the same layer, and the third electrode 301 is a surface electrode. An electric field in the direction perpendicular to the first substrate is formed between the third electrode 301 and the first electrode 101 and between the third electrode 301 and the second electrode 201. FIG. 6 shows a schematic diagram of a structure of another display panel according to an embodiment of the present disclosure, and FIG. 6 shows the third electrode 301. As shown in FIG. 6, the first electrode 101 and the second electrode 201 are arranged in the same layer, and a plurality of third electrodes 301 are arranged in an array on the second substrate. An electric field in the direction perpendicular to the first substrate is formed between the third electrode 301 and the first electrode 101 and between the third electrode 301 and the second electrode 201.

In the embodiments of the present disclosure, when the electric field in the direction parallel to the first substrate 100 does not exist in the display panel, and only the electric field in the direction perpendicular to the first substrate 100 exists, the two-dimensional material is perpendicular to the first substrate 100, and the overall reflectivity of the dimming layer is the lowest. When the electric field in the direction parallel to the first substrate 100 is large enough, the two-dimensional material is parallel to the first substrate 100 and the overall reflectivity of the dimming layer is the highest. By controlling the magnitude of electric field in the direction parallel to the first substrate, the control over the tilt angle α of the two-dimensional material may be achieved (refer to FIG. 7A), so as to control the overall reflectivity of the dimming layer.

Figure 7A:
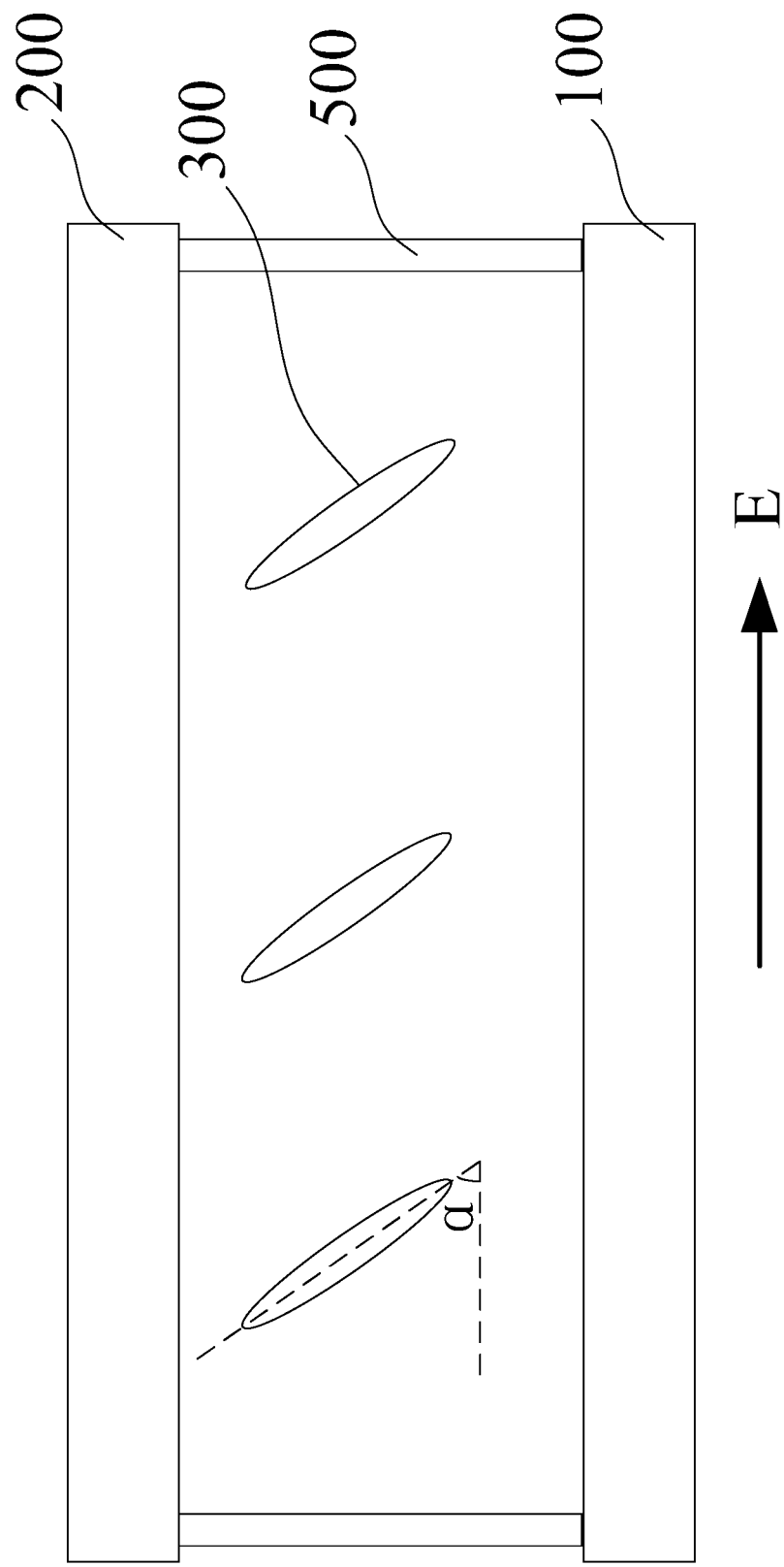
FIG. 7A to FIG. 7B are schematic diagrams illustrating work of a display panel under the action of an electric field in a direction parallel to the first substrate.
Figure 7B:
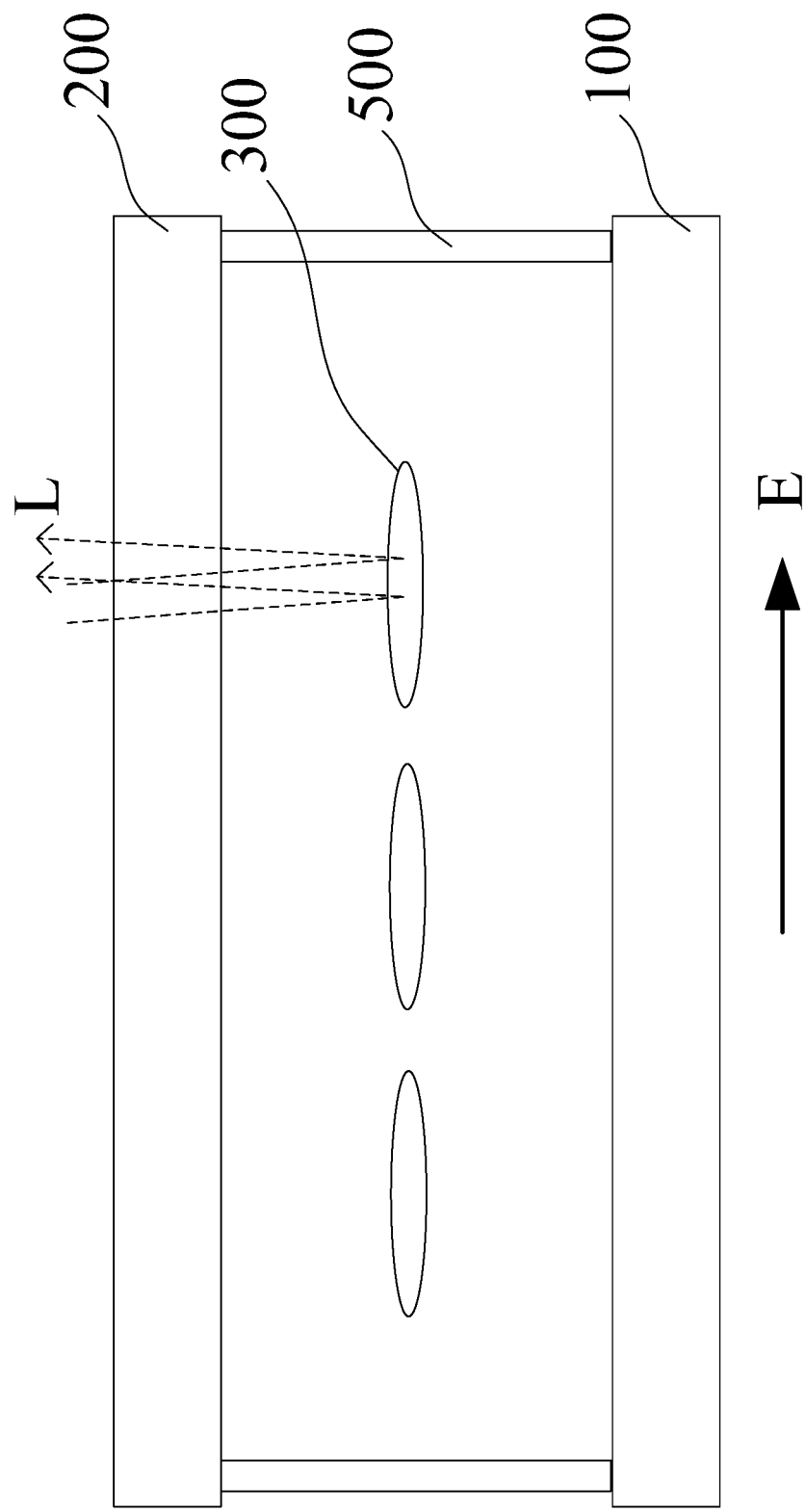
Figure 8A:
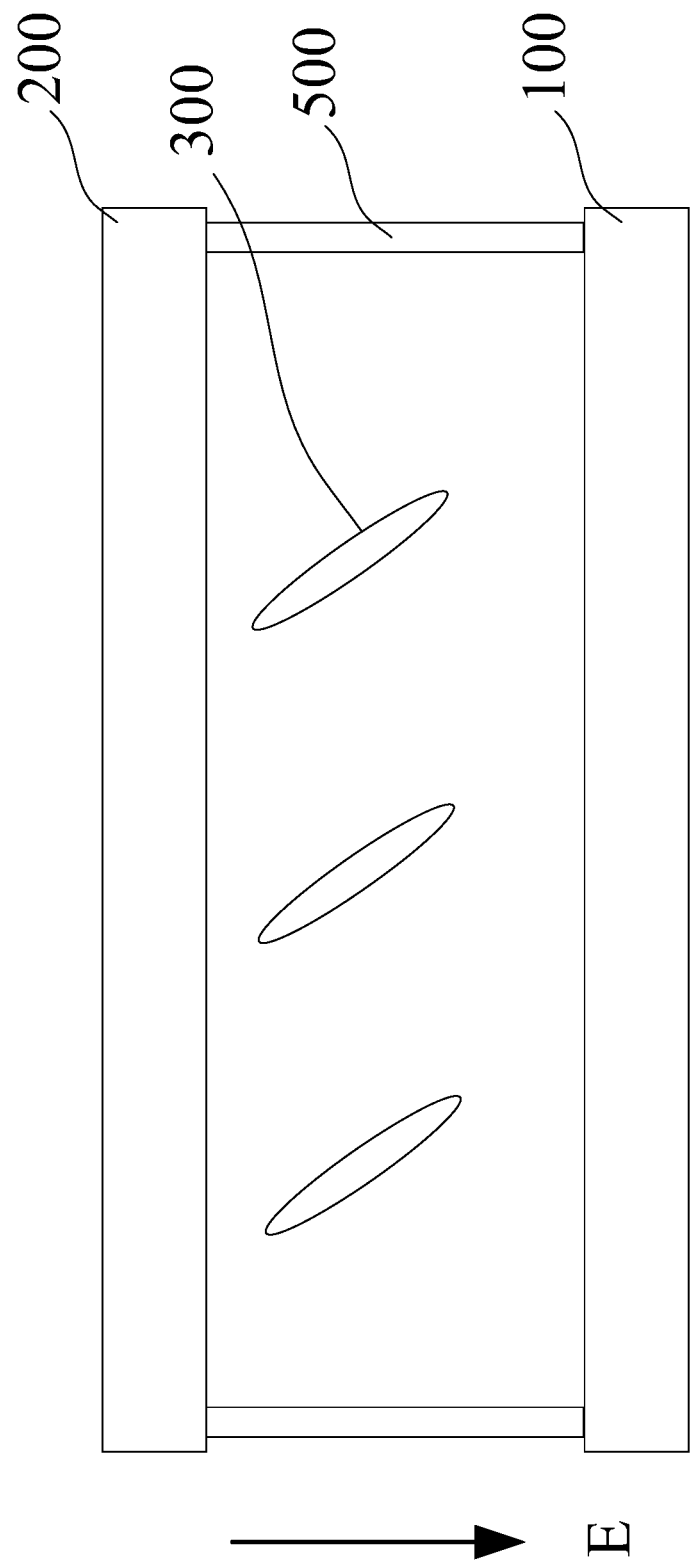

FIG. 7A to FIG. 7B and FIG. 8A to FIG. 8B are schematic diagrams of the working principle of the display panel according to the embodiments of the present disclosure. Here, an example in which the electrode pair on the first substrate provides an electric field in the direction parallel to the first substrate is taken for illustration. As shown in FIG. 7A and FIG. 7B, when opposite voltages are applied to the electrode pair, and the electrode pair generates an electric field (E) in the direction parallel to the first substrate, the graphene oxide is distributed horizontally. In this case, external light (L) will be reflected, and the sub-pixel unit corresponding to the electrode pair presents a bright state. As shown in FIG. 8A and FIG. 8B, when the same voltage is applied to the electrode pair, and an electric field (E) in the direction perpendicular to the first substrate is generated under the action of the electrode pair and the electrodes on the second substrate, the graphene oxide is distributed vertically. In this case, external light (L) will transmit through the dimming layer and will not be reflected, and the sub-pixel unit corresponding to the electrode pair presents a dark state. By applying different voltages to the electrode pair, the tilt angle α of the graphene oxide may be controlled to be different, such that sub-pixel unit presents different gray scales. Here, the opposite voltages means that the voltages have the same value but opposite polarities, and the same voltage means that the voltage has the same value and same polarity.

In the embodiments of the present disclosure, all of the first electrode 101, the second electrode 201 and the third electrode are transparent electrodes. By adopting the design of the transparent electrodes, it is ensured that light can transmit through the electrodes smoothly to reach to the dimming layer. For example, all of the first electrode 101, the second electrode 201 and the third electrode may be Indium Tin Oxide (ITO) electrodes or Indium Zinc Oxide (IZO) electrodes. The electrode made of ITO or IZO has good electrical conductivity and thin thickness.

In the embodiments of the present disclosure, the first substrate 100 further includes a plurality of thin-film transistors (TFT) arranged in an array. Each sub-pixel unit in the display panel corresponds to at least one thin-film transistor. In each sub-pixel unit, all of the electrodes (including the first electrode, the second electrode and the third electrode) are connected to the thin-film transistor and each electrode is controlled by the thin-film transistor. Alternatively, only one kind of electrodes (For example, all of the first electrodes or all of the second electrodes) are connected to the thin-film transistor, and the one kind of electrodes are controlled by the thin-film transistor, and the other two kinds of electrodes may be applied with voltage directly. Each thin-film transistor is only connected to one electrode, and the thin-film transistors connected to different electrodes are different. The plurality of thin-film transistors constitute the thin-film transistor structure layer 102 in FIG. 1 and FIG. 3.

In the embodiments of the present disclosure, the sub-pixel units in the display panel are arranged in an array, and the thin-film transistors in each row of sub-pixel units are turned on at the same time, such that the electric signal from the source electrode of the thin-film transistor may be transmitted to the electrode connected thereto through the drain electrode of the thin-film transistor. After the electric signal is applied to the electrode, the electrode and another electrode (constant voltage) pair form an electric field with a corresponding intensity, so as to control the graphene oxide to deflect. Thus, the active-matrix drive of the display panel is achieved, and the control over the gray scale of various sub-pixel units is further achieved.

In the embodiments of the present disclosure, the thin-film transistor may be a bottom-gate type thin-film transistor, a top-gate type thin-film transistor, or a dual-gate type thin-film transistor, which is not limited in embodiments of the present disclosure. Hereinafter, a bottom-gate type thin-film transistor is taken as an example for illustration.

The bottom-gate type thin-film transistor includes a gate electrode layer (gate electrode and gate line), gate electrode insulating layer, an active layer, a source-drain electrode layer (source electrode, drain electrode and data line) and a passivation layer sequentially stacked on the base substrate (not shown in the figure) of the first substrate 100. In the embodiments of the present disclosure, the electrodes are disposed on the passivation layer, and the electrodes are electrically connected to the drain electrode of the source-drain electrode layer through the via-hole in the passivation layer.

In the embodiments of the present disclosure, the base substrate of the first substrate 100 may be a glass substrate. The gate electrode insulating layer and the passivation layer may be silicon nitride layers or silicon oxynitride layers. The gate electrode layer and the source-drain electrode layer may be metal electrode layers, such as aluminum (Al) layers, copper (Cu) layers, molybdenum (Mo) layers, chromium (Cr) layers, titanium (Ti) layers, etc., and may also be alloy electrode layers. The active layer may be manufactured with amorphous silicon, microcrystalline silicon, or polycrystalline silicon. For example, the active layer may include an amorphous silicon layer disposed on the gate electrode insulating layer and an N-type doped amorphous silicon layer disposed on the amorphous silicon layer.

In the embodiments of the present disclosure, the display panel further includes a drive circuit which is connected to all of the electrodes (the first electrode, the second electrode and the third electrode). If the electrode is connected to a thin-film transistor, the drive circuit is electrically connected to the electrode through the thin-film transistor. If the electrode is not connected to a thin-film transistor, the drive circuit is electrically connected to the electrode directly. During the display process, the voltage of the electrode on the second substrate (for example, the third electrode) may maintain constant, the voltage of one kind of electrode (for example, the second electrode) of the electrode pair on the first substrate maintains constant, and the voltage of the other kind of electrode (for example, the first electrode) is controlled through the thin-film transistor, so as to control the electric field of each sub-pixel unit. Thus, the deflection of the graphene oxide may be controlled, thereby achieving the control over the gray scale of the sub-pixel unit. For the convenience of connecting the drive circuit and the electrodes, the display panel further includes electrode leads. For example, one electrode lead may be used to connect the electrodes with constant voltages on the first substrate to the drive circuit, so as to apply the electric signal to the electrodes through the drive circuit.

In the embodiments of the present disclosure, the first substrate 100 may further include a light absorbing layer 103. Here, the light absorbing layer is on the side, away from the second substrate 200, of the first substrate 100. By designing the light absorbing layer at the bottom of the first substrate, light within visible spectrum transmitting through the dimming layer may be absorbed, to avoid multiple reflection of light in the display panel which may affect the normal display.

In the embodiments of the present disclosure, the light absorbing layer 103 is a black material layer. For example, the light absorbing layer 103 is a carbon black layer. The light absorbing effect is good when the light absorbing layer is manufactured with carbon black.

In the embodiments of the present disclosure, the display panel further includes a light diffusion layer 202. The second substrate 200 is located on the light-emitting side of the display panel, and the light diffusion layer 202 is disposed on the side, away from the first substrate 100, of the second substrate 200. The light diffusion layer is located above the second substrate, which can increase the viewing angle of the panel.

In the embodiments of the present disclosure, the second substrate 200 includes such structures as a base substrate 203, a black matrix 204, a color filter layer 205, and so on. The display panel realizes the color display through the color filter layer. It should be noted that the color filter layer 205 and the light absorbing layer 103 are disposed on different substrates.

In the embodiments of the present disclosure, the display panel further includes a supporting structure 500 disposed between the second substrate 200 and the first substrate 100. The first substrate and the second substrate are separated by the supporting structure 500, to ensure the distance between second substrate and the first substrate, thereby ensuring the stability of the dimming layer. The supporting structure 500 may be manufactured with an elastic organic material.

The embodiments of the present disclosure further provide a display device, which includes the above-mentioned display panel.

In the embodiments of the present disclosure, the display device may be any products or components with a display function, such as a mobile phone, a tablet computer, a TV, a display, a laptop computer, a digital photo frame, a navigator, etc.

In the embodiments of the present disclosure, when the two-dimensional material with reflective property is used as an optical switch, and when the two-dimensional material is parallel to the first substrate, light incident from the second substrate side is reflected, and then is emitted out from the second substrate to form the bright spot in the picture. When the two-dimensional material is perpendicular to the first substrate, light incident from the second substrate side will pass through the dimming layer, and will not be reflected out by the dimming layer. Thus, a dark spot is formed in the picture. However, when the two-dimensional material tilts, since a certain amount of two-dimensional materials are included in each sub-pixel unit in the display panel, the light will be reflected back and forth between the two-dimensional materials, and finally some of the light will be reflected. In addition, the greater the angle of inclination between the two-dimensional material and the first substrate is, the less the amount of reflected light is. Therefore, the angle of inclination of the two-dimensional material corresponding to each sub-pixel unit can be adjusted by controlling the magnitude of the electric field through the first electrode and the second electrode, such that the amount of light reflected by the two-dimensional material in the sub-pixel unit is different, thereby realizing different brightness at various points in the picture. Thus, gray-scale control is achieved. Since the display panel is not provided with a liquid crystal layer, there is no need to arrange an alignment film and a polaroid, such that the display panel becomes thinner and lighter. The display panel is a reflective panel, and therefore the backlight electric energy may be saved in the environment of light irradiation, thereby reducing the power consumption of the display panel. Furthermore, the display device with this display panel may not be provided with a backlight source. That is, a reflective display panel without the alignment film and the polaroid is provided. The display function of the display device may be realized by reflecting the ambient light by the two-dimensional material. As no backlight source is provided, the thickness of the display device is greatly reduced, which can realize the lightness and thinness of the display device.

In the embodiments of the present disclosure, the display device may further include a backlight source (It should be noted that the display panel does not include the light absorbing layer in such an implementation). The first substrate of the display panel is located between the second substrate and the backlight source. By arranging the backlight source, the display device can not only be used in the environment with light irradiation (the backlight source does not work at this time) but also be used in the environment without light irradiation (the backlight source works at this time). In the environment without light irradiation, the electric field controls the two-dimensional material to rotate. When the two-dimensional material is perpendicular to the first substrate, light from the backlight source may be transmitted out to form a bright spot. When two-dimensional material is parallel to the first substrate, light from the backlight source is shielded to form a dark spot.

In the embodiments of the present disclosure, the backlight source may adopts a light-emitting diode (LED) backlight source, to ensure the low power consumption of the display device.

In the embodiments of the present disclosure, the first substrate in the display device may also be manufactured to be a transparent substrate. For example, the thin-film transistor in the first substrate may be manufactured to be transparent, and meanwhile no light absorbing layer is provided, so as to make the first substrate be transparent. Meanwhile, the second substrate is replaced with a transparent cover plate. By way of this design, a transparent display device can be achieved, to improve the application prospect thereof.

The foregoing descriptions are only exemplary embodiments of the present disclosure, and are not intended to limit the present disclosure. Any modifications, equivalent substitutions, improvements, etc. made within the spirit and principles of the disclosure shall be included in the protection scope of the appended claims of the present disclosure.

What is claimed is:

1. A display panel, comprising:
a first substrate;
a second substrate cell-aligned with the first substrate;
a first electrode;
a second electrode, the first electrode and the second electrode being used to provide an electric field;
a third electrode; and
a dimming layer between the first substrate and the second substrate, the dimming layer comprising a two-dimensional material deflected between a direction perpendicular to the first substrate and a direction parallel to the first substrate under the action of the electric field,
wherein the first electrode and the second electrode are used to form a first-direction electric field;
the third electrode and one of the first electrode and the second electrode are used to form a second-direction electric field; and
one of the first-direction electric field and the second-direction electric field is an electric field in a direction perpendicular to the first substrate, and the other of the first-direction electric field and the second-direction electric field is an electric field in a direction parallel to the first substrate.

2. The display panel according to claim 1, wherein the two-dimensional material is a reflective material.

3. The display panel according to claim 1, wherein a thickness of the dimming layer is 2~5 μm.

4. The display panel according to claim 1, wherein the first electrode is on the first substrate and the second electrode is on the second substrate, the first electrode and the second electrode being used to form the electric field in the direction perpendicular to the first substrate; and
the third electrode is on the first substrate, the third electrode and the first electrode being used to form the electric field in the direction parallel to the first substrate.

5. The display panel according to claim 4, further comprising: a plurality of sub-pixel units in an arrangement of array in a display area,
wherein each of the sub-pixel units comprises one second electrode, and comprises at least one of the first electrodes and at least one of the third electrodes.

6. The display panel according to claim 4, further comprising: a plurality of sub-pixel units in an arrangement of array in a display area, wherein each of the sub-pixel units comprises at least one of the first electrodes and at least one of the third electrodes, and the second electrode is a surface electrode.

7. The display panel according to claim 1, wherein one of the first substrate and the second substrate comprises a color filter layer.

8. The display panel according to claim 1, further comprising: a supporting structure between the second substrate and the first substrate.

9. The display panel according to claim 8, wherein the light absorbing layer is a black material layer.

10. The display panel according to claim 1, further comprising: a light absorbing layer, wherein the second substrate is on a light-emitting side of the display panel and the light absorbing layer is on the first substrate.

11. The display panel according to claim 1, wherein the dimming layer comprises graphene oxide suspension liquid.

12. The display panel according to claim 11, wherein a range of grain size of graphene oxide in the graphene oxide suspension liquid is 5~7 μm, and a range of concentration of the graphene oxide suspension liquid is 0.2 wt~0.4 wt %.

13. The display panel according to claim 11, wherein the graphene oxide in the graphene oxide suspension liquid is doped with a metal material.

14. The display panel according to claim 11, wherein a surface of the graphene oxide in the graphene oxide suspension liquid is covered with a metal material.

15. The display panel according to claim 14, wherein an electrical conductivity of the metal material is higher than an electrical conductivity of the graphene oxide in the graphene oxide suspension liquid.

16. A display device, comprising: a display panel;
wherein the display panel comprises:
a first substrate;
a second substrate cell-aligned with the first substrate;
a first electrode;
a second electrode, the first electrode and the second electrode being used to provide an electric field;
a third electrode; and
a dimming layer between the first substrate and the second substrate, the dimming layer comprising a two-dimensional material deflected between a direction perpendicular to the first substrate and a direction parallel to the first substrate under the action of the electric field,
wherein the first electrode and the second electrode are used to form a first-direction electric field;
the third electrode and one of the first electrode and the second electrode are used to form a second-direction electric field; and
one of the first-direction electric field and the second-direction electric field is an electric field in a direction perpendicular to the first substrate, and the other of the first- direction electric field and the second-direction electric field is an electric field in a direction parallel to the first substrate.

17. The display device according to claim 16, wherein the two-dimensional material is a reflective material.

18. The display device according to claim 16, further comprising: a backlight source, wherein the second substrate is on a light-emitting side of the display panel and the backlight source is on a side, away from the second substrate, of the first substrate.

19. The display device according to claim 16, wherein the dimming layer comprises graphene oxide suspension liquid.

20. The display device according to claim 19, wherein a range of grain size of graphene oxide in the graphene oxide suspension liquid is 5~7 μm, and a range of concentration of the graphene oxide suspension liquid is 0.2 wt~0.4 wt %.

* * * * *